United States Patent
Curtin et al.

(10) Patent No.: US 7,091,414 B2
(45) Date of Patent: Aug. 15, 2006

(54) FINE RESOLUTION PIN SUPPORT FIXTURE WITH LIGHT WEIGHT DESIGN

(75) Inventors: Mark Curtin, Cromston, RI (US); Eric Bauer, Nashua, NH (US)

(73) Assignee: Transition Automation, Inc., N. Billerica, MA (US)

(*) Notice: Subject to any disclaimer, the term of this patent is extended or adjusted under 35 U.S.C. 154(b) by 0 days.

(21) Appl. No.: 10/668,786

(22) Filed: Sep. 23, 2003

(65) Prior Publication Data

US 2004/0127076 A1 Jul. 1, 2004

Related U.S. Application Data

(63) Continuation of application No. PCT/US02/12570, filed on Apr. 23, 2002.

(60) Provisional application No. 60/285,774, filed on Apr. 23, 2001.

(51) Int. Cl.
*H05K 5/00* (2006.01)

(52) U.S. Cl. ........................ 174/52.1; 361/742; 439/55; 439/79

(58) Field of Classification Search ............... 174/52.1, 174/255, 250, 261, 262; 439/55, 79, 74, 439/81, 82, 392, 342; 361/736, 742
See application file for complete search history.

(56) References Cited

U.S. PATENT DOCUMENTS

| | | | |
|---|---|---|---|
| 3,619,478 A | 11/1971 | Staiger | |
| 3,670,409 A | 6/1972 | Reimer | |
| 4,859,188 A * | 8/1989 | Neumann | 439/45 |
| 4,950,173 A | 8/1990 | Minemura et al. | |
| 2004/0026444 A1* | 2/2004 | DeSilva et al. | 221/208 |

* cited by examiner

Primary Examiner—Dean A. Reichard
Assistant Examiner—Adolfo Nino
(74) Attorney, Agent, or Firm—Gauthier & Connors LLP

(57) ABSTRACT

A pin support structure comprising a first foil having opening and a second foil having openings. The first foil is secured to a foil support frame and the second foil is secured to a foil support frame. The foils are maintained in spaced apart relationship by a separation frame. The holes of the foil are in registration with the holes of the foil. The holes in the foils are formed by electro-chemical etching. A pin has a base end and a support end.

9 Claims, 3 Drawing Sheets

FINE RESOLUTION PIN SUPPORT FIXTURE WITH LIGHT WEIGHT DESIGN

This is a continuation of copending application(s) International Application PCT/US02/12570 filed on Apr. 23, 2002 and which designated the U.S. This application also claims the benefit of provisional application No. 60/285,774 filed Apr. 23, 2001.

BACKGROUND OF THE INVENTION

1. Field of the Invention

A pin support fixture for supporting the side of a pc board which side has electronic components thereon.

2. Discussion of the Relevant Art

In pc board assembly, electronic components are mounted on both sides of the board. When components are mounted on a first side, side 1, the other side, side 2, is simply supported on a planar surface. To mount components on side 2 the card is inverted. Side 1 with the components can be supported on a mirror image molded surface but usually a table or fixture having pins extending upwardly therefrom supports the board. The pins contact the side 1 where there are no components (otherwise referred to as a 'bare board' location). The positioning of the pins is generally through a 'blind' selection process. Pins are randomly inserted and if they contact the side 1 after being inserted a known distance from the plate to the surface of the side 1 they are secured. Most methods require machined metal tables and the total pin support fixture is generally about twenty (20) pounds.

BRIEF SUMMARY OF THE INVENTION

Broadly the invention comprises a pin support fixture which eliminates the 'blind' pin selection process of the prior art and is light weight, e.g. five (5) pounds, for ease of handling.

Broadly, the invention comprises two suspended foils each having a large array of finely spaced holes, two foil support frames, and a separation frame. When assembled, the holes of the foils are in registration.

The two etched metal foils allow a fine resolution of holes to be created, without the concomitant increase in cost or manufacturing time, associated with increasing the resolution of a common metal plate with holes machined in place as in the prior art.

The high density of holes, 0.13 inch pit versus 0.4 inch pitch for prior art plates, allows suitable pin support locations to be found more easily and therefore the invention is more precise. Because pin supports must be located at places on the side 1 of the pc board which lack components, the current invention offers a much greater chance of locating onto an existing 'bare board' location. This reduces the total time consumed during the setup of the pin array fixture, and increases the effective support due to the ability to better disperse support locations and not being left without suitable spots to locate a pin.

The geometry of the foils offers natural transparency, which allows the pins to be set, by seeing through the fixture while the fixture is inverted and aligned with a sample board.

As a final step the pins are all simultaneously fixed into position by use of a magnetic plate. These features enable the fixture to be inverted and inserted into the production machine with minimal strain and minimal setup time.

By utilizing etched "foils" to create fine holes, a densely spaced array of support locations is created, without a concomitant increase in the cost or manufacturing time. For example, in a preferred embodiment, there are 9660 discreet support locations. A typical prior art system only allows about 1,200 discreet supports and each support location is created by machining each hole.

By utilizing suspended foils with etched holes, precision and repeatability are obtained on the order of +/−0.003 inches for pin position, without significant weight. The weight of this fixture is 5 lbs. compared to more than 20 lbs. for competing fixtures.

The suspended foils allow the pin positions to be selected by seeing through the fixture, greatly aiding the pin selection process, whereas competing methods offer only blind selection processes which are error prone and time consuming (10 minutes for setup time, versus 30 minutes for competing methods).

DESCRIPTION OF THE PREFERRED EMBODIMENT(S)

Figure 1:
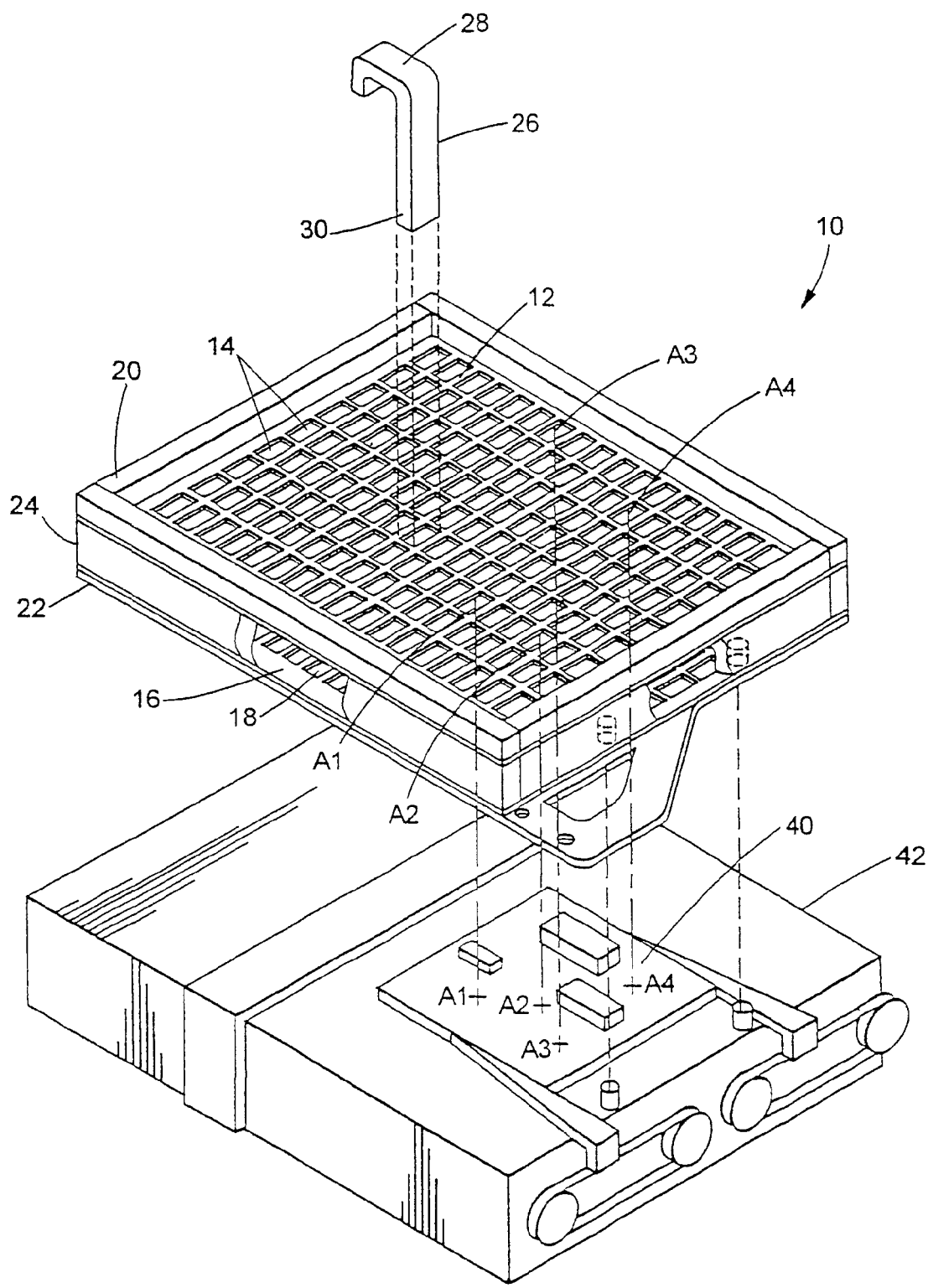
FIG. 1 is a telescopic perspective view of a fixture embodying the invention in a pin locating position.

Referring to FIG. 1, a fixture is shown generally at 10 and comprises a first foil 12 having openings 14 and a second foil 16 having openings 18. The first foil 12 is secured to a foil support frame 20 and the second foil 16 is secured to a foil support frame 22. The foils are maintained in spaced apart relationship by a separation frame 24. The holes 14 of the foil 12 are in registration with the holes 18 of the foil 16. The holes in the foils are formed by electro-chemical etching. A pin 26, only one shown in FIG. 1 for clarity, has a base end 28 and a support end 30.

Aligned below the fixture 10 is a pc board 40 which is secured in position in a pc board support structure shown generally at 42. The structure 42 and the alignment of the board 40 to a pc board structure is well known in the art and need not be described in detail.

Board support locations on the pc board 40 are shown as A1 through A4. Corresponding pin locations which would pass through the apertures 14/18 are identified as A1 through A4. After a suitable number of support pins 26 have been positioned, pins are secured, as will be described for FIG. 2. The fixture is then inverted and inserted into the production machine.

Figure 2:
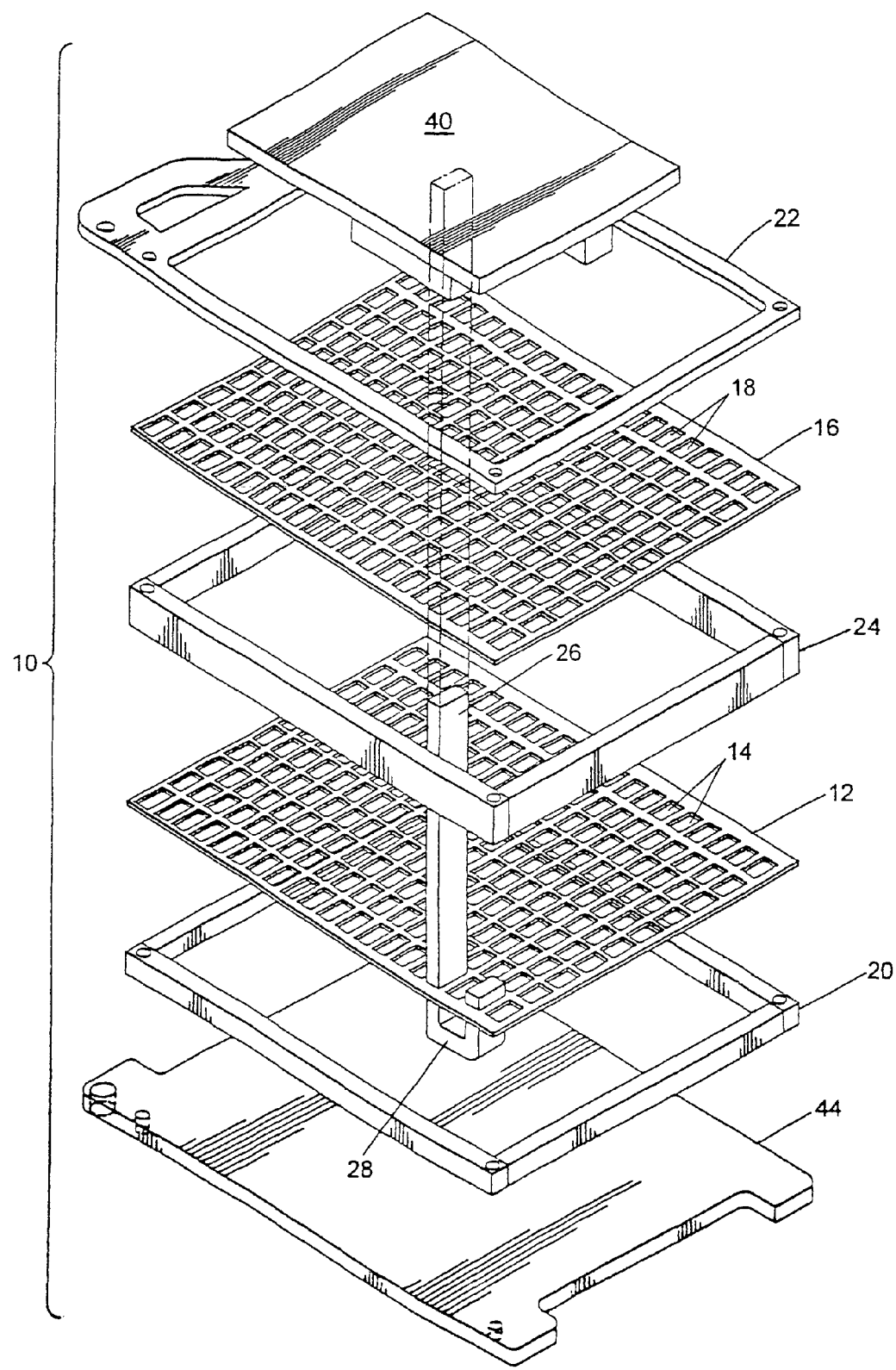
FIG. 2 is a telescopic perspective view of the fixture in a board support position.

Referring to FIG. 2, the fixture 10 is shown in greater detail in its support/inverted position. A magnetic plate 44 is attached to the frame 20 and the base end 28 of the pin 26 to secure the pin 26 in position. For accuracy, the pin 26 is received in the holes 14/18 in sliding, frictional engagement to ensure there is no lateral displacement of the pin 26 while the magnetic plate 44 ensures there is no vertical displacement of the pin.

Figure 3:
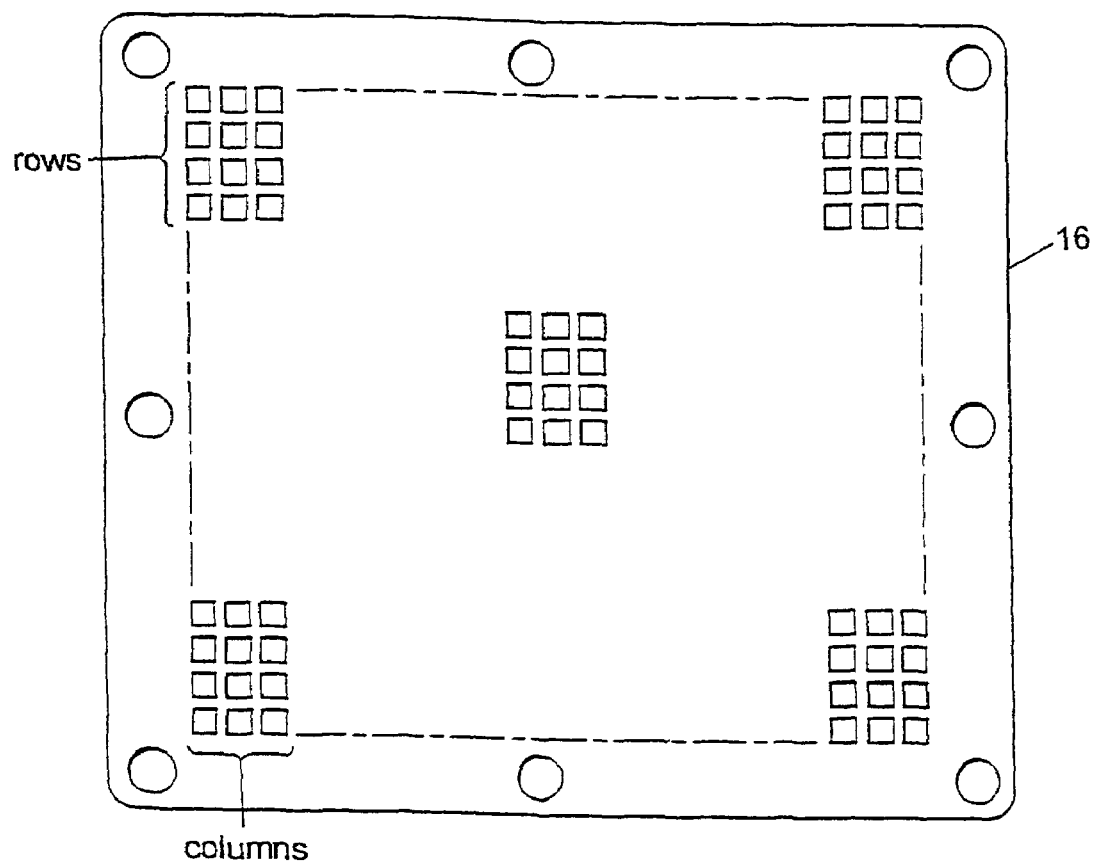
FIG. 3 is a plan view of a foil of the invention.

The foil 16 (the foil 12 being identical thereto) is shown in greater detail in FIG. 3.

In a preferred embodiment, square holes are etched through the foil in an 84×115 array, typically 84 rows by 115 columns, totaling 9660 discreet support locations. The plate is stainless steel 0.012 inches thick. The square holes have sides 0.1 inches and are spaced apart from one another vertically and horizontally by 0.03 inches. The plates 12 and 16 are spaced apart 0.75 inches. This geometric configuration allows an operator to 'see through' the fixture 10 to position or place the pin 26. With this example, other geometric configurations are within the scope of the invention.

The invention has been described with reference to square holes, a particular configuration of a pin having a U-shaped base with the bases of the pins being secured by a magnetic plate. Configuration of the pins/holes could be other geometric configurations such as circular, elliptical, etc. Further other means to secure the pins in position to prevent their vertical displacement is within the scope of the invention, such as clamping a bottom plate to a foil support frame using threaded fasteners, etc.

The foregoing description has been limited to a specific embodiment of the invention. It will be apparent, however, that variations and modifications can be made to the invention, with the attainment of some or all of the advantages of the invention. Therefore, it is the object of the appended claims to cover all such variations and modifications as come within the true spirit and scope of the invention.

The invention claimed is:

1. A reusable pin support fixture which comprises:
an upper apertured foil;
a lower apertured foil;
means for maintaining the foils in spaced apart relationship, the apertures of the foils being in registration;
a plurality of pins having a support end and a base end, the base end secured to the lower foil and the support end passing through an aperture and the upper foil; and
means for removably securing the pins in the lower foil.

2. The fixture of claim 1 wherein the geometry of the fixture is configured such that it can be seen through for pin placement.

3. The fixture of claim 1 wherein means for securing the pins is a magnetic plate.

4. The fixture of claim 1 wherein the base end is U-shaped.

5. The fixture of claim 1 wherein the pins and apertures are dimensioned to prevent lateral displacement of the pins when they are received in the apertures.

6. The fixture of claim 1 wherein the means for maintaining in spaced-apart relationship is a spacer frame.

7. The fixture of claim 1 wherein the pins are removable.

8. The fixture of claim 1 wherein the pins may be rearranged in the aperatures.

9. The fixture of claim 1 wherein the fixture may be disassembled and then reassembled.

* * * * *